United States Patent
Arlbrant

(10) Patent No.: US 10,638,227 B2
(45) Date of Patent: Apr. 28, 2020

(54) PROCESSING OF AN AUDIO INPUT SIGNAL

(71) Applicant: DIRAC RESEARCH AB, Uppsala (SE)

(72) Inventor: Mattias Arlbrant, Uppsala (SE)

(73) Assignee: DIRAC RESEARCH AB, Uppsala (SE)

(*) Notice: Subject to any disclaimer, the term of this patent is extended or adjusted under 35 U.S.C. 154(b) by 0 days.

(21) Appl. No.: 16/466,096

(22) PCT Filed: Dec. 2, 2016

(86) PCT No.: PCT/SE2016/051206
§ 371 (c)(1),
(2) Date: Jun. 3, 2019

(87) PCT Pub. No.: WO2018/101868
PCT Pub. Date: Jun. 7, 2018

(65) Prior Publication Data
US 2019/0306624 A1    Oct. 3, 2019

(51) Int. Cl.
*H04R 3/08* (2006.01)
*H03G 3/30* (2006.01)
(Continued)

(52) U.S. Cl.
CPC ........... *H04R 3/08* (2013.01); *G10L 21/02* (2013.01); *H03G 3/3005* (2013.01);
(Continued)

(58) Field of Classification Search
CPC . H04R 3/08; H04R 3/007; H04R 3/04; H04R 2430/01; H04R 2430/03;
(Continued)

(56) References Cited

U.S. PATENT DOCUMENTS

| 2004/0093208 A1 | 5/2004 | Yin |
| 2010/0103776 A1 | 4/2010 | Chan |
| 2012/0101813 A1 | 4/2012 | Vaillancourt et al. |

FOREIGN PATENT DOCUMENTS

| EP | 2 273 493 A1 | 1/2011 |
| EP | 2 680 260 A1 | 1/2014 |

(Continued)

OTHER PUBLICATIONS

International Search Report, dated Sep. 13, 2017, from PCT application No. PCT/SE2016/051206.
(Continued)

*Primary Examiner* — Ahmad F. Matar
*Assistant Examiner* — Sabrina Diaz
(74) *Attorney, Agent, or Firm* — Young & Thompson

(57) ABSTRACT

There is provided a method for processing an audio input signal and a corresponding audio filter system. The method includes applying non-linear time-domain processing to the input signal to generate a processed copy of the input signal, transforming the input signal and the processed copy of the input signal to the frequency domain, and performing a comparison in the frequency-domain based on the transformed input signal and the transformed processed copy of the input signal. The method also includes determining at least one control parameter based on the comparison, performing frequency-domain processing of the transformed input signal based on the control parameter, and generating an output signal by transforming the frequency-domain processed signal to the time domain.

20 Claims, 6 Drawing Sheets

(51) Int. Cl.
  *H04R 3/00* (2006.01)
  *H03G 9/00* (2006.01)
  *H03G 9/02* (2006.01)
  *G10L 21/02* (2013.01)
  *G10L 21/0324* (2013.01)

(52) U.S. Cl.
  CPC ............. *H03G 9/005* (2013.01); *H03G 9/025* (2013.01); *H04R 3/007* (2013.01); *G10L 21/0324* (2013.01); *H04R 2430/01* (2013.01); *H04R 2430/03* (2013.01); *H04R 2499/11* (2013.01)

(58) Field of Classification Search
  CPC ........ H03G 3/3005; H03G 3/001; H03G 3/00; H03G 3/20
  USPC .................................. 381/55, 94.1, 94.2, 98
  See application file for complete search history.

(56) References Cited

FOREIGN PATENT DOCUMENTS

EP        2 720 222 A1    4/2014
WO     2012/110415 A1    8/2012

OTHER PUBLICATIONS

Written Opinion (PCT/ISA/237) dated Sep. 13, 2017, by the Swedish Patent Office as the International Searching Authority for PCT Application No. PCT/SE2016/051206.

PROCESSING OF AN AUDIO INPUT SIGNAL

TECHNICAL FIELD

The proposed technology generally relates to audio processing, and in particular to a method for processing an audio input signal, an audio filter system configured to process an audio input signal, a corresponding computer program and computer-program product as well as an audio system and an improved audio signal.

BACKGROUND

In general, there is a demand for efficient signal processing for audio applications. For example, the persistent trend toward miniaturization and portability of devices equipped with loudspeakers is raising the demands on signal processing algorithms. Consumers expect audio performance to improve or at least not drop even as playback devices decrease in size, reducing their acoustical performance.

In the field of audio-signal processing for consumer audio devices, it is very common to employ several kinds of dynamic-range processing to adapt the audio signal to the available hardware and the intended playback environment. In general, when the playback devices are miniature loudspeakers such as those used in mobile phones, it is desirable to apply dynamic-range compression in order to boost low level parts of the audio signal in order to boost audibility and loudness. Furthermore, it is desirable to employ limiting for preventing the audio signal from exceeding the maximum allowed levels of digital amplitude and loudspeaker membrane excursion.

One of the most important types of processing for miniature loudspeakers is limiters. Limiters prevent signals from exceeding a threshold amplitude-level, they work by applying an attenuation gain commensurate with the amount by which a given signal exceeds the threshold level. The time for the limiter to reach full attenuation is often called attack time and is typically used in combination with a look-ahead time of comparable size. The time for the limiter gain to return to neutral gain after a moment of suppression is often called release time.

Traditional limiters suffer from several types of artifacts which can make the audio sound bad in different ways.

Setting limiter time constants normally involves a compromise between a loud but distorted output on one hand, and a less distorted but weaker output on the other hand. In general, longer time constants produce a more natural sounding result, but at the expense of loudness since the gain remains low for longer times. At one extreme, setting the attack and release times to zero results in clipping of the signal to the threshold level. The sound will be very loud but also very distorted due to the strong high-frequency content in the gain signal which modulates the input as it is applied. At the other extreme, a very long release time reduces the amount of high-frequency content in the gain signal while at the same time reducing loudness too much for many applications. Another problem with long release times is that it can cause unnecessary over-suppression over a period of time after the suppression of a transient part of the audio signal. This artifact is sometimes called "hole punching". Moderate release time settings also have their problems; namely audible modulation in the form of so called "pumping", an audible change of level of the whole signal as the gain quickly recovers after suppression. Pumping is especially audible on signals with transient high-level sounds embedded in wide-band background sounds. For low-frequency periodic signals which overshoot the threshold level, limiters with short release times can trigger on each cycle of the waveform and cause a distorted sound as they modulate the periodic signal. A general artifact of traditional time-domain limiters is that they suppress the whole frequency range of the signal, which can result in a dull or muffled sound.

There is thus a general need for solutions that may eliminate or at least reduce some or all of the described processing artifacts.

SUMMARY

It is an object of the invention to provide a method for processing an audio input signal It is another object to provide an audio filter system configured to process an audio input signal.

It is also an object to provide a computer program for processing, when executed by a processor, an audio input signal.

Another object is to provide a corresponding a computer-program product.

Yet another object is to provide an audio system comprising an audio filter system.

Still another object is to provide an improved audio signal.

These and other objects are met by embodiments of the proposed technology.

According to a first aspect there is provided a method for processing an audio input signal. The method comprises:
  applying non-linear time-domain processing to the input signal to generate a processed copy of the input signal;
  transforming the input signal and the processed copy of the input signal to the frequency domain;
  performing a comparison in the frequency-domain based on the transformed input signal and the transformed processed copy of the input signal;
  determining at least one control parameter based on the comparison;
  performing frequency-domain processing of the transformed input signal based on the control parameter(s); and
  generating an output signal by transforming the frequency-domain processed signal to the time domain.

According to a second aspect there is provided an audio filter system configured to process an audio input signal. The filter system is configured to apply non-linear time-domain processing to the input signal to generate a processed copy of the input signal. The filter system is also configured to transform the input signal and the processed copy of the input signal to the frequency domain. The filter system is configured to perform a comparison in the frequency-domain based on the transformed input signal and the transformed processed copy of the input signal. Further, the filter system is configured to determine at least one control parameter based on said comparison. The filter system is also configured to perform frequency-domain processing of the transformed input signal based on the control parameter(s). The filter system is configured to generate an output signal by transforming the frequency-domain processed signal to the time domain.

According to a third aspect there is provided a computer program for processing, when executed by a processor, an audio input signal, wherein said computer program comprises instructions, which when executed by the processor, cause the processor to:

apply non-linear time-domain processing to the input signal to generate a processed copy of the input signal;

transform the input signal and the processed copy of the input signal to the frequency domain;

perform a comparison in the frequency-domain based on the transformed input signal and the transformed processed copy of the input signal;

determine at least one control parameter based on the comparison;

perform frequency-domain processing of the transformed input signal based on the control parameter(s); and generate an output signal by transforming the frequency-domain processed signal to the time domain.

According to a fourth aspect there is provided a computer-program product comprising a computer-readable medium having stored thereon such a computer program.

According to a fifth aspect there is provided an audio system comprising a filter system according to the second aspect.

According to a sixth aspect there is provided an audio signal generated by the method according to the first aspect.

In this way, the proposed technology provides an efficient approach for audio signal processing wherein desirable aspects of a non-linearly processed signal may be imposed on the original signal by means of frequency-domain processing.

Other advantages will be appreciated when reading the following detailed description of non-limiting embodiment of the invention.

BRIEF DESCRIPTION OF DRAWINGS

The embodiments, together with further objects and advantages thereof, may best be understood by making reference to the following description taken together with the accompanying drawings, in which.

DETAILED DESCRIPTION

Throughout the drawings, the same reference designations are used for similar or corresponding elements.

Figure 1:
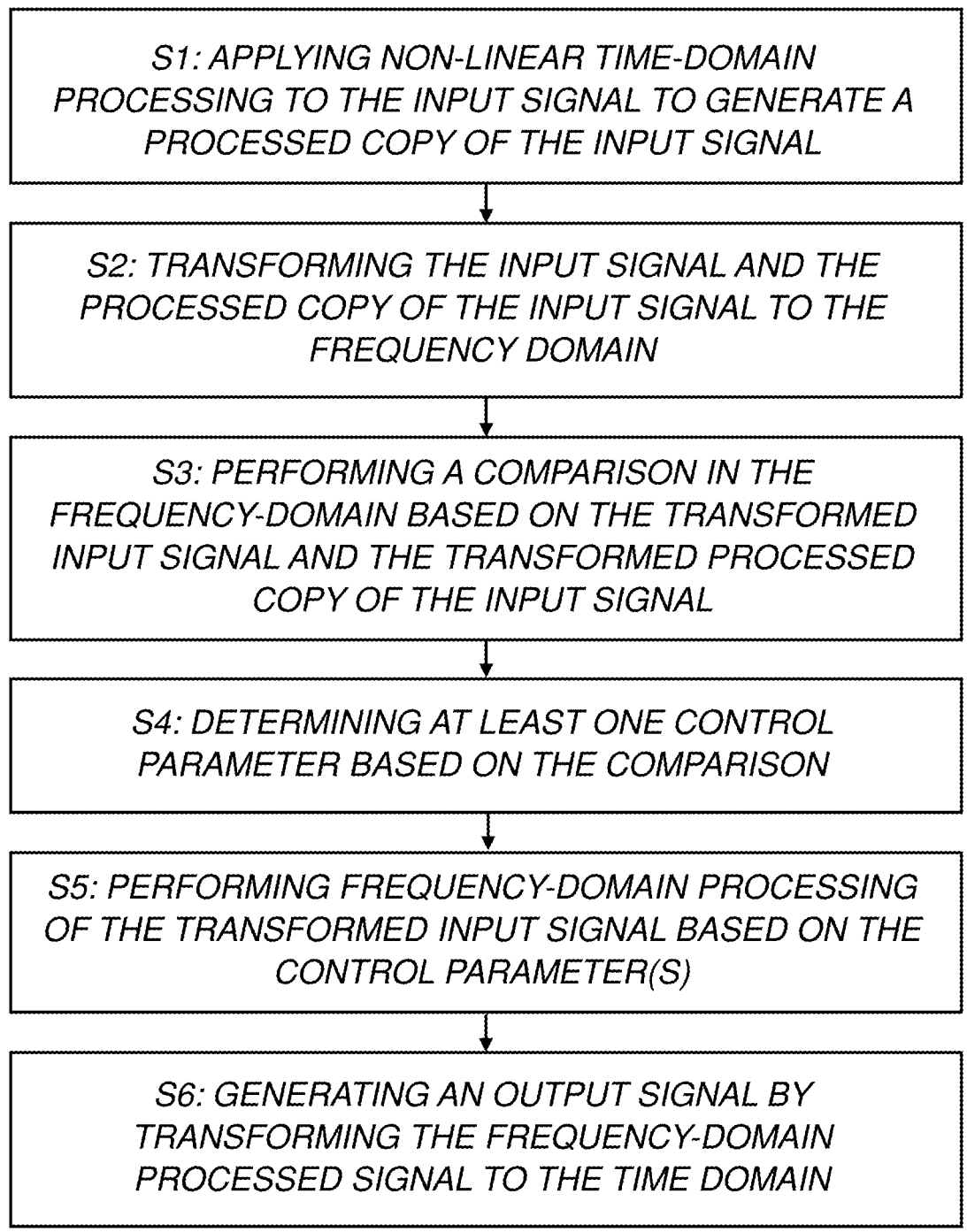
FIG. 1 is a schematic flow diagram illustrating an example of a method for processing an audio input signal.

FIG. 1 is a schematic flow diagram illustrating an example of a method for processing an audio input signal.

Basically, the method comprises the following steps:

S1: applying non-linear time-domain processing to the input signal to generate a processed copy of the input signal;

S2: transforming the input signal and the processed copy of the input signal to the frequency domain;

S3: performing a comparison in the frequency-domain based on the transformed input signal and the transformed processed copy of the input signal;

S4: determining at least one control parameter based on said comparison;

S5: performing frequency-domain processing of the transformed input signal based on said control parameter(s); and S6: generating an output signal by transforming the frequency-domain processed signal to the time domain.

In this way, the proposed technology provides an efficient approach for audio signal processing wherein desirable aspects of a non-linearly processed signal may be imposed on the original signal by means of frequency-domain processing.

By way of example, the above processing enhances or suppresses characteristics present in the processed copy of the input signal.

For example, the processing may be adapted to suppress frequency components such that their levels do not exceed the levels of corresponding frequency components in the processed copy of the input signal.

In a particular example, the control parameter(s) includes a frequency-dependent gain, and the frequency-domain processing includes multiplication of the frequency-domain representation of the input with the gain.

Optionally, the maximum attenuation of the gain may be limited to a frequency-dependent threshold, and a frequency-dependent spectral smoothing may be applied to the gain.

As an example, the comparison may comprise selecting the minimum of a predetermined value, such as unity, and the ratio between the magnitude of the unprocessed input and the magnitude of the processed input.

In a particular example, the non-linear time-domain processing of the input signal comprises clipping of the input signal to a predetermined level.

For example, the non-linear time-domain processing of the input signal may comprise processing corresponding to clipping the membrane excursion of an electrodynamic loudspeaker to a predetermined level.

A particular embodiment of the proposed invention, which may be applied to limiter applications, enables reduction of at least some or all of the artifacts of the prior art by analysing the signal and suppressing the frequency components of the input signal according to the amount by which they contribute to amplitudes overshooting the threshold.

It will be appreciated that the methods and arrangements described herein can be implemented, combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

Figure 2:
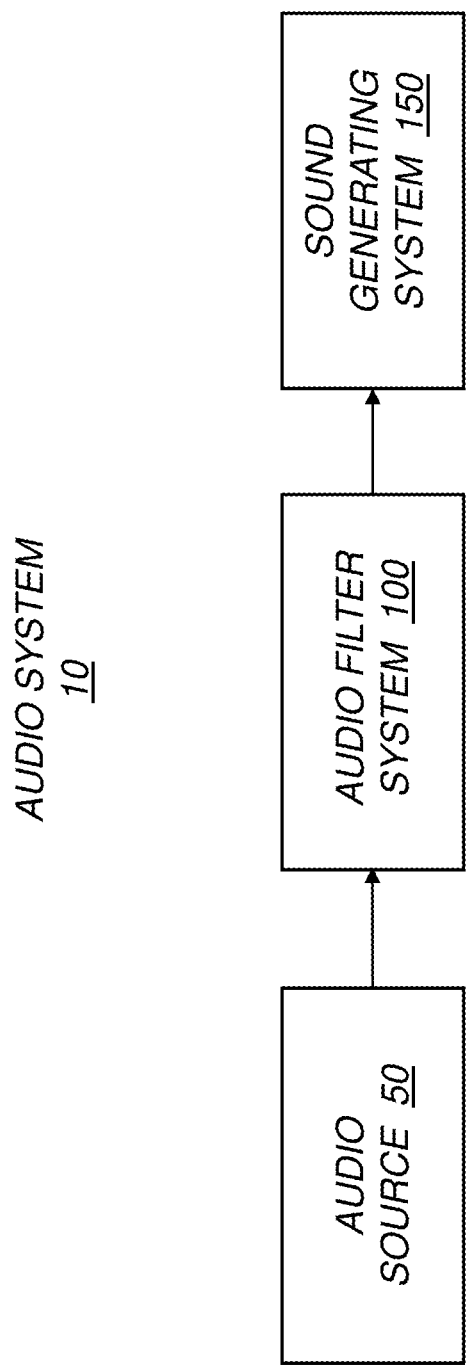
FIG. 2 is a schematic block diagram illustrating an example of an audio system.

FIG. 2 is a schematic block diagram illustrating an example of an audio system. The audio system 10 basically comprises an audio source 50, an audio filter system 100 and a sound generating system 150.

In general, the audio filter system 100 is configured to process an audio input signal. The filter system is configured to apply non-linear time-domain processing to the input signal to generate a processed copy of the input signal. The filter system is configured to transform the input signal and the processed copy of the input signal to the frequency domain. The filter system is also configured to perform a comparison in the frequency-domain based on the transformed input signal and the transformed processed copy of the input signal. The filter system is configured to determine at least one control parameter based on said comparison. The filter system is configured to perform frequency-domain processing of the transformed input signal based on said control parameter(s). The filter system is further configured to generate an output signal by transforming the frequency-domain processed signal to the time domain.

By way of example, the filter system may be configured to enhance or suppress characteristics present in the processed copy of the input signal.

For example, the filter system may be configured to suppress frequency components such that their levels do not exceed the levels of corresponding frequency components in the processed copy of the input signal.

In a particular example, the control parameter(s) includes a frequency-dependent gain, and the frequency-domain processing includes multiplication of the frequency-domain representation of the input with the gain.

Optionally, the filter system is configured to limit the maximum attenuation of the gain to a frequency-dependent threshold, and to apply a frequency-dependent spectral smoothing to the gain.

As an example, the comparison comprises selecting the minimum of a predetermined value, such as unity, and the ratio between the magnitude of the unprocessed input and the magnitude of the processed input.

In a particular example, the non-linear time-domain processing of the input signal comprises clipping of the input signal to a predetermined level.

For example, the non-linear time-domain processing of the input signal may comprise processing corresponding to clipping the membrane excursion of an electrodynamic loudspeaker to a predetermined level.

Optionally, the filter system comprises at least one post-processing stage for performing additional signal processing.

Figure 3:
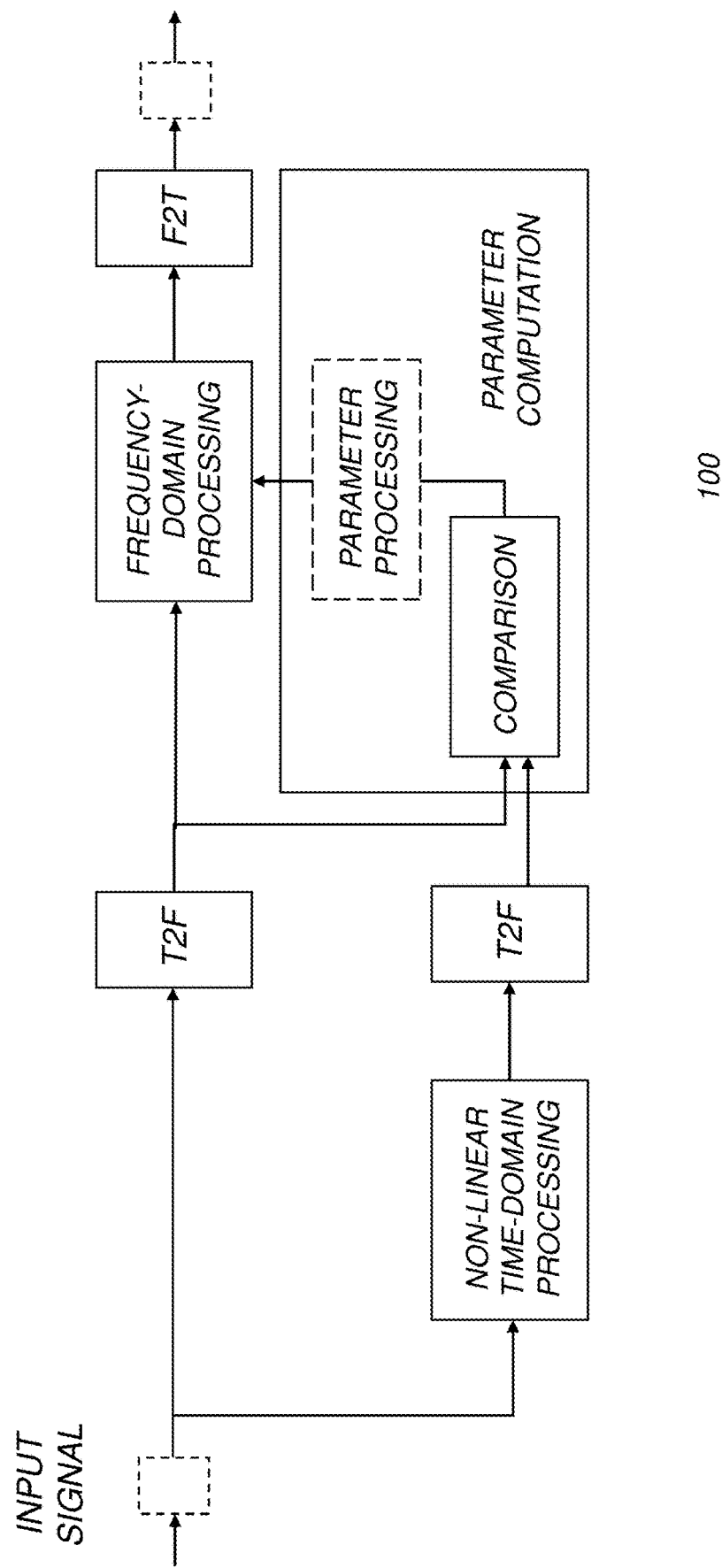
FIG. 3 is a schematic block diagram illustrating an example of an audio filter system according to an embodiment.

FIG. 3 is a schematic block diagram illustrating an example of an audio filter system according to an embodiment.

In this particular example embodiment, a non-linear operation is performed on a copy of the input signal. A first example of such a non-linear operation is the clipping of the signal to a pre-determined level. A second example is the processing of the copy of the input signal using a non-linear model of loudspeaker excursion and saturation. A further example is the processing of the copy of the input signal using a modified non-linear model of loudspeaker excursion and saturation, in which saturation occurs at a lower level than in the loudspeaker upon which the model is based. Other examples of processing are also possible.

In the example embodiment, Time-To-Frequency (T2F) transformations are applied to both the input signal and the output signal from the non-linear time-domain processing block.

An example of such a Time-To-Frequency (T2F) transformation is the Short-Time Fourier Transform (STFT) in which successive overlapping frames of the input signal are transformed to the frequency domain by means of the Fast Fourier transform (FFT). A particular example of such a transform uses an overlap of 50% and a frame size of 1024 samples.

In the example embodiment, a comparison is made between the transformed input signal and the transformed processed copy of the input signal. An example of such a comparison is based on determining the magnitude ratio between the two spectra:

$$\text{magnitude Ratio}(k) = \text{absolute value}(X2(k)) / \text{absolute value}(X1(k))$$

where X1(k) corresponds to the spectrum of the input signal at the discrete frequency index k, and X2(k) corresponds to the spectrum of the processed copy of the input signal at the discrete frequency index k.

As an example, the output of the comparison block may be the spectral magnitude ratio, which is a control parameter for each discrete frequency index.

By way of example, the control parameters may optionally be further processed in order to form a frequency dependent gain. For example, this processing comprises:

Forming an intermediate spectrum H'(k) by taking the minimum of unity and the spectral magnitude ratio:

$$H'(k) = \text{Min}(1.0, \text{Magnitude Ratio}(k)), \text{ for all discrete frequency indices } k$$

Forming an intermediate spectrum H"(k) by taking the maximum of a frequency-dependent threshold level and the spectrum H"(k):

$$H''(k) = \text{Max}(\text{Threshold Level}(k), H'(k))$$

Forming a frequency-dependent gain G(k) by applying a smoothing operation across discrete frequency indices k on the intermediate spectrum H"(k)

As an example, the frequency-domain processing may comprise applying the frequency-dependent, real-valued gain G(k) to the complex-valued spectrum X1(k) by multiplication.

In the next stage of the example embodiment, a time-domain output signal is formed by applying a Frequency-To-Time (F2T) transformation to the output of the frequency-domain processing block. An example of such a transformation is the inverse or reconstruction stage of a Short-Time Fourier Transform (STFT) in which successive output spectra are transformed to the time domain by means of Inverse Fast Fourier transform (IFFT), and then windowed before the output signal is formed by summing the windowed overlapped blocks.

Optionally, one or more pre-processing stages and/or one or more post-processing stages may be included, as indicated by the optional dashed boxes in FIG. 3. By way of example, an additional limiter stage may optionally be added as a post-processing stage.

Figure 4A:
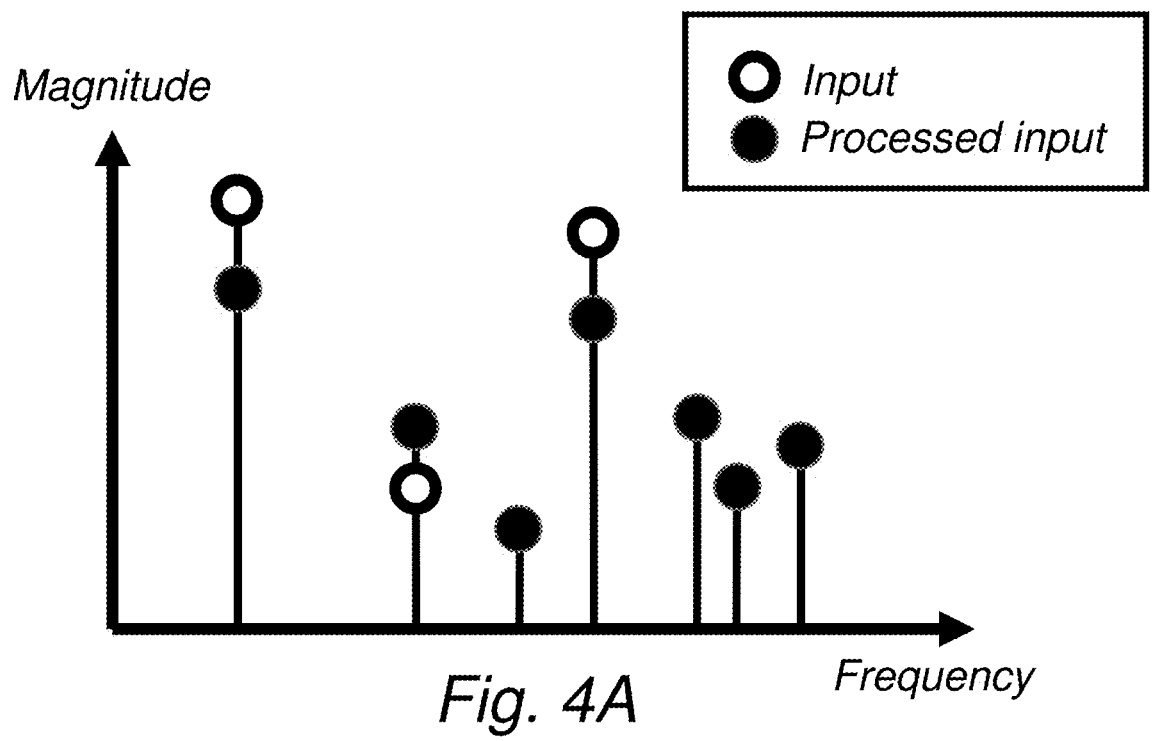
FIGS. 4A-B are schematic diagrams illustrating examples of spectrums as magnitude versus frequency and magnitude ratio versus frequency, respectively.
Figure 4B:
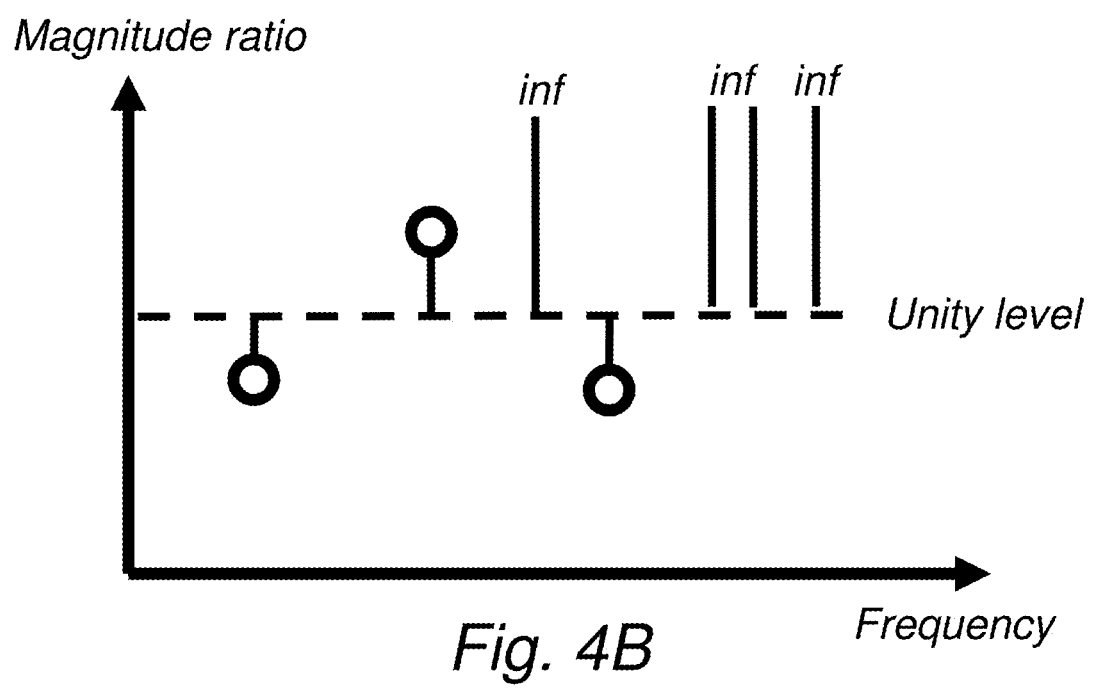

FIGS. 4A-B are schematic diagrams illustrating examples of spectrums as magnitude versus frequency and magnitude ratio versus frequency, respectively.

FIG. 4A is illustrating the magnitude spectrum of an example signal input with two harmonic spectral components, as well as the magnitude spectrum of a non-linearly processed copy of said input signal. In the spectrum of the processed signal, the levels have changed compared to the input and additional spectral components are present.

FIG. 4B is illustrating the ratio between the magnitude spectra of FIG. 4A, the ratio is infinite at the frequencies of the new spectral components, and the ratio is lower than unity at the frequencies of the original spectral components.

Figure 5:
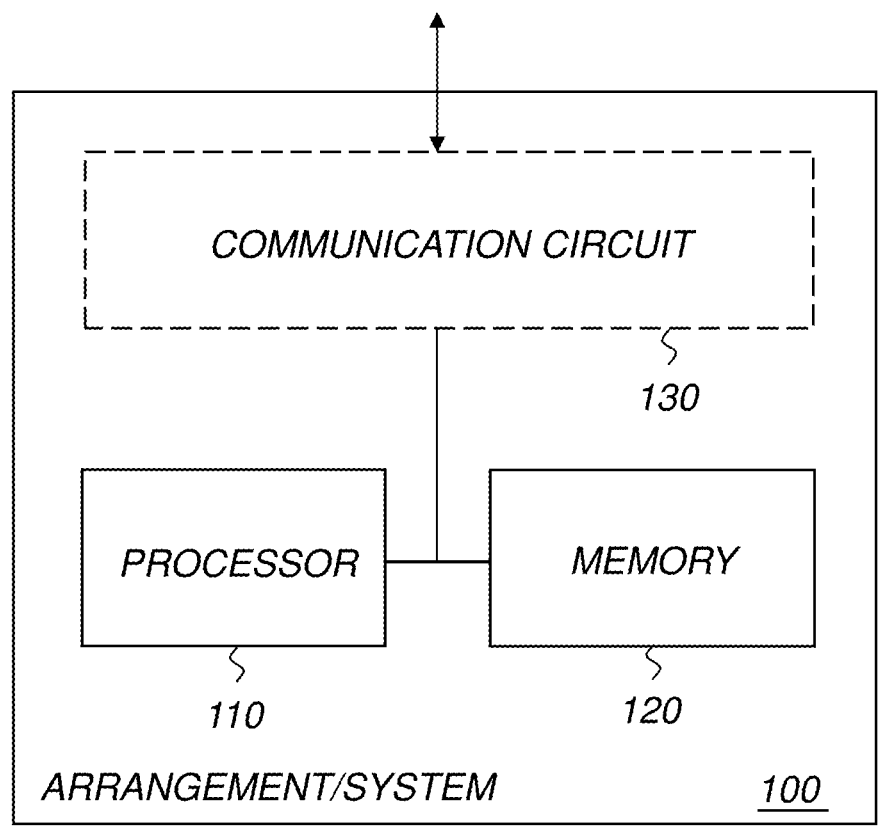
FIG. 5 is a schematic block diagram illustrating an example of a processor-memory implementation of an audio filter system according to an embodiment.

FIG. 5 is a schematic block diagram illustrating an example of an arrangement/system 100, based on a processor-memory implementation according to an embodiment. In this particular example, the arrangement/system 100 comprises a processor 110 and a memory 120, the memory 120 comprising instructions executable by the processor 110, whereby the processor is operative to implement the aspects of the proposed technology described herein, including processing the audio input signal.

Optionally, the arrangement/system 100 may also include a communication circuit 130. The communication circuit 130 may include functions for wired and/or wireless communication with other devices, but may simply be a suitable input/output (I/O) device, input port(s) and/or output port(s).

It is also possible to provide a solution based on a combination of hardware and software. The actual hardware-software partitioning can be decided by a system designer based on a number of factors including processing speed, cost of implementation and other requirements.

Figure 6:
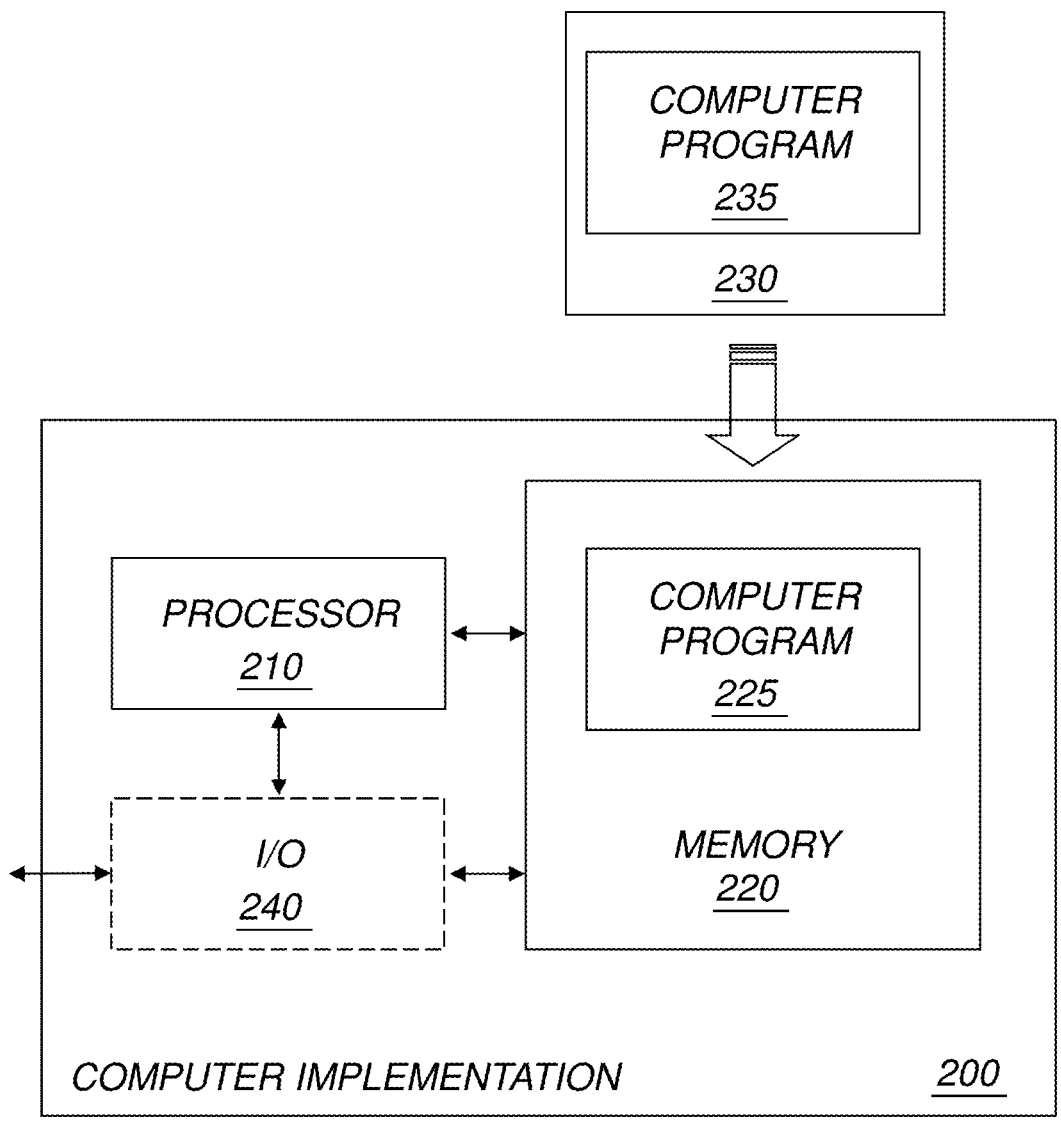
FIG. 6 is a schematic block diagram illustrating an example of a computer implementation according to an embodiment.

FIG. 6 is a schematic diagram illustrating an example of a computer-implementation 200 according to an embodiment. In this particular example, at least some of the steps, functions, procedures, modules and/or blocks described herein are implemented in a computer program 225; 235, which is loaded into the memory 220 for execution by processing circuitry including one or more processors 210. The processor(s) 210 and memory 220 are interconnected to each other to enable normal software execution. An optional input/output device 240 may also be interconnected to the processor(s) 210 and/or the memory 220 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 210 is thus configured to perform, when executing the computer program 225, well-defined processing tasks such as those described herein.

The processing circuitry does not have to be dedicated to only execute the above-described steps, functions, procedure and/or blocks, but may also execute other tasks.

In a particular embodiment, the computer program 225; 235 comprises instructions, which when executed by the processor 210, cause the processor 210 to perform the tasks described herein, including tasks related to the audio filer system. More specifically, the instructions, when executed by the processor 210, cause the processor 210 to:

apply non-linear time-domain processing to the input signal to generate a processed copy of the input signal;
transform the input signal and the processed copy of the input signal to the frequency domain;
perform a comparison in the frequency-domain based on the transformed input signal and the transformed processed copy of the input signal;
determine at least one control parameter based on said comparison;
perform frequency-domain processing of the transformed input signal based on said control parameter(s); and
generate an output signal by transforming the frequency-domain processed signal to the time domain.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program 225; 235 may be realized as a computer program product, which is normally carried or stored on a computer-readable medium 220; 230, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The procedural flows presented herein may be regarded as a computer flows, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method for processing an audio input signal, the method comprising:
    applying non-linear time-domain processing to the input signal to generate a processed copy of the input signal;
    transforming the input signal and the processed copy of the input signal to the frequency domain;
    performing a comparison in the frequency-domain based on the transformed input signal and the transformed processed copy of the input signal;
    determining at least one control parameter based on said comparison;
    performing frequency-domain processing of the transformed input signal based on said at least one control parameter; and
    generating an output signal by transforming the frequency-domain processed transformed input signal to the time domain.

2. The method of claim 1, wherein characteristics present in the processed copy of the input signal are enhanced or suppressed.

3. The method of claim 1, wherein said frequency-domain processing suppresses frequency components of the transformed input signal such that levels of the frequency components do not exceed the levels of corresponding frequency components in the transformed processed copy of the input signal.

4. The method of claim 1, wherein said at least one control parameter includes a frequency-dependent gain, and said frequency-domain processing includes multiplication of the frequency-domain representation of the transformed input signal with said gain.

5. The method of claim 4, wherein a maximum attenuation of said gain is limited to a frequency-dependent threshold, and a frequency-dependent spectral smoothing is applied to said gain.

6. The method of claim 1, wherein the comparison comprises selecting the minimum of a predetermined value and a ratio between a magnitude of the transformed input signal and a magnitude of the transformed processed copy of the input signal.

7. The method of claim 1, wherein the non-linear time-domain processing of the input signal comprises clipping of the input signal to a predetermined level.

8. The method of claim 1, wherein the non-linear time-domain processing of the input signal comprises processing corresponding to clipping a membrane excursion of an electrodynamic loudspeaker to a predetermined level.

9. An audio filter system configured to process an audio input signal, the audio filter system comprising:
at least one processor configured to
apply non-linear time-domain processing to the input signal to generate a processed copy of the input signal,
transform the input signal and the processed copy of the input signal to the frequency domain,
perform a comparison in the frequency-domain based on the transformed input signal and the transformed processed copy of the input signal,
determine at least one control parameter based on said comparison,
perform frequency-domain processing of the transformed input signal based on said at least one control parameter, and
generate an output signal by transforming the frequency-domain processed transformed input signal to the time domain.

10. The audio filter system of claim 9, wherein said at least one processor is configured to enhance or suppress characteristics present in the processed copy of the input signal.

11. The audio filter system of claim 9, wherein said at least one processor is configured to suppress frequency components of the transformed input signal such that levels of the frequency components do not exceed the levels of corresponding frequency components in the transformed processed copy of the input signal.

12. The audio filter system of claim 9, wherein said at least one control parameter includes a frequency-dependent gain, and said frequency-domain processing includes multiplication of the frequency-domain representation of the transformed input signal with said gain.

13. The audio filter system of claim 12, wherein said at least one processor is configured to limit a maximum attenuation of said gain to a frequency-dependent threshold, and to apply a frequency-dependent spectral smoothing to said gain.

14. The audio filter system of claim 9, wherein the comparison comprises selecting the minimum of a predetermined value and a ratio between a magnitude of the transformed input signal and a magnitude of the transformed processed copy of the input signal.

15. The audio filter system of claim 9, wherein the non-linear time-domain processing of the input signal comprises clipping of the input signal to a predetermined level.

16. The audio filter system of claim 9, wherein the non-linear time-domain processing of the input signal comprises processing corresponding to clipping a membrane excursion of an electrodynamic loudspeaker to a predetermined level.

17. The audio filter system of claim 9, further comprising a memory comprising instructions, which when executed by the at least one processor, cause the at least one processor to process the audio input signal.

18. The audio filter system of claim 9, wherein the audio filter system comprises at least one post-processing stage to perform additional signal processing.

19. A non-transitory computer-readable medium having stored thereon a computer program for processing, when executed by a processor, an audio input signal, wherein said computer program comprises instructions, which when executed by the processor, cause the processor to:
apply non-linear time-domain processing to the input signal to generate a processed copy of the input signal;
transform the input signal and the processed copy of the input signal to the frequency domain;
perform a comparison in the frequency-domain based on the transformed input signal and the transformed processed copy of the input signal;
determine at least one control parameter based on said comparison;
perform frequency-domain processing of the transformed input signal based on said at least one control parameter; and
generate an output signal by transforming the frequency-domain processed transformed input signal to the time domain.

20. An audio system comprising:
the audio filter system of claim 9.

* * * * *